United States Patent
Makino et al.

(10) Patent No.: US 9,627,171 B2
(45) Date of Patent: Apr. 18, 2017

(54) CHARGED PARTICLE BEAM DEVICE

(71) Applicant: HITACHI HIGH-TECHNOLOGIES CORPORATION, Tokyo (JP)

(72) Inventors: Hiroshi Makino, Tokyo (JP); Hideyuki Kazumi, Tokyo (JP); Minoru Yamazaki, Tokyo (JP); Yuzuru Mizuhara, Tokyo (JP); Miki Isawa, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 14/410,999

(22) PCT Filed: Jun. 10, 2013

(86) PCT No.: PCT/JP2013/065910
§ 371 (c)(1),
(2) Date: Dec. 23, 2014

(87) PCT Pub. No.: WO2014/002734
PCT Pub. Date: Jan. 3, 2014

(65) Prior Publication Data
US 2015/0357153 A1   Dec. 10, 2015

(30) Foreign Application Priority Data

Jun. 28, 2012 (JP) ................ 2012-144901

(51) Int. Cl.
*G21K 7/00* (2006.01)
*H01J 37/147* (2006.01)
(Continued)

(52) U.S. Cl.
CPC ......... *H01J 37/147* (2013.01); *H01J 37/244* (2013.01); *H01J 37/28* (2013.01);
(Continued)

(58) Field of Classification Search
CPC ....................................... H01J 37/00
(Continued)

(56) References Cited

U.S. PATENT DOCUMENTS 6,025,593 A   2/2000   Suzuki et al.
6,864,482 B2  3/2005   Sato et al.
(Continued)

FOREIGN PATENT DOCUMENTS

JP   10-302705 A   11/1998
JP   2821153 B2   11/1998
(Continued)

OTHER PUBLICATIONS

Leal-Quiros et al., New Tilted-Poles Wien Filter with Enhanced Performance, 1989, Review of Scientific Instruments, 60, pp. 350-357.*
(Continued)

*Primary Examiner* — Wyatt Stoffa
*Assistant Examiner* — Jason McCormack
(74) *Attorney, Agent, or Firm* — McDermott Will & Emery LLP

(57) ABSTRACT

An objective of the present invention is to provide a charged particle beam device with which information based on a charged particle which is discharged from a bottom part of high-aspect structure is revealed more than with previous technology. To achieve the objective, proposed is a charged particle beam device comprising: a first orthogonal electromagnetic field generator which deflects charged particles which are discharged from a material; a second orthogonal electromagnetic field generator which further deflects the charged particles which are deflected by the first orthogonal electromagnetic field generator; an aperture forming member having a charged particle beam pass-through aperture; and a third orthogonal electromagnetic field generator which (Continued)

deflects the charged particles which have passed through the aperture forming member.

8 Claims, 6 Drawing Sheets

(51) Int. Cl.
*H01J 37/244* (2006.01)
*H01J 37/28* (2006.01)

(52) U.S. Cl.
CPC ............... *H01J 2237/2449* (2013.01); *H01J 2237/24485* (2013.01); *H01J 2237/281* (2013.01); *H01J 2237/2806* (2013.01)

(58) Field of Classification Search
USPC .......................................... 250/306, 307, 311
See application file for complete search history.

(56) References Cited

U.S. PATENT DOCUMENTS

| | | | |
|---|---|---|---|
| 7,105,814 B2 | 9/2006 | Knippelmeyer | |
| 2006/0243906 A1 | 11/2006 | Fukada et al. | |
| 2007/0069150 A1* | 3/2007 | Frosien | H01J 37/05 250/396 ML |
| 2007/0272857 A1* | 11/2007 | Hasegawa | H01J 37/29 250/307 |
| 2008/0067378 A1* | 3/2008 | Kawasaki | H01J 37/153 250/310 |
| 2008/0121803 A1* | 5/2008 | Shojo | H01J 37/153 250/307 |
| 2008/0237465 A1* | 10/2008 | Hatano | G01N 23/225 250/311 |
| 2009/0218506 A1* | 9/2009 | Nakasuji | H01J 37/05 250/396 ML |
| 2011/0284758 A1* | 11/2011 | Sawada | H01J 37/153 250/396 ML |
| 2012/0112066 A1* | 5/2012 | Ogiso | G06T 7/001 250/307 |
| 2013/0292568 A1* | 11/2013 | Bizen | G01B 15/00 250/307 |

FOREIGN PATENT DOCUMENTS

| | | | | |
|---|---|---|---|---|
| JP | 2002-367552 A | 12/2002 | | |
| JP | 2004-134387 A | 4/2004 | | |
| JP | 2004-342341 A | 12/2004 | | |
| JP | 2006-332038 A | 12/2006 | | |
| JP | 3932894 B2 | 6/2007 | | |
| JP | 2012-003902 A | 1/2012 | | |
| JP | WO 2012081428 A1 * | 6/2012 | ............ | G01B 15/00 |
| WO | WO 2012081428 A1 * | 6/2012 | | |

OTHER PUBLICATIONS

Leal-Quiros et al., New Tilted Wien Filter with Enhanced Performance, 1989, Review of Scientific Instruments, 60, pp. 350-357.*
International Search Report issued in PCT/JP2013/065910, dated Jul. 16, 2013, with English translation.

* cited by examiner (a)          (b)

(a)

(b)

(a)

(b)

(c)

CHARGED PARTICLE BEAM DEVICE

RELATED APPLICATIONS

This application is the U.S. National Phase under 35 U.S.C. §371 of International Application No. PCT/JP2013/065910, filed on Jun. 10, 2013, which in turn claims the benefit of Japanese Application No. 2012-144901, filed on Jun. 28, 2012, the disclosures of which Applications are incorporated by reference herein.

TECHNICAL FIELD

The present invention relates to a charged particle beam device which performs observation, measurement, inspection, or the like of microscopic objects such as a semiconductor device and a liquid crystal, and particularly to a charged particle beam device which is suitable for observation, measurement, inspection, or the like of a high-aspect structure such as a deep trench or a deep hole.

BACKGROUND ART

In a semiconductor device manufacturing line, dimensional control of a circuit pattern is regarded as an indispensable technology for improvement of yield and control of quality. For the dimensional control, a CD-SEM (Critical-Dimension Scanning Electron Microscopy) is used which is a type of the charged particle beam device and applies an electron microscope which realizes high spatial resolution. The CD-SEM realizes a high spatial resolution with a low energy electron beam and can measure a lateral (in an in-plane direction of a circuit pattern) dimension of a circuit pattern with sub-nanometer accuracy.

Patent Literature 1 discloses an orthogonal electromagnetic field generator (hereinafter, also called ExB deflector or ExB type filter) which deflects electrons which are discharged from a sample to the outside of the axis of the electron beam without deflecting the electron beam which is discharged from an electron source. Patent Literature 1 also describes that another ExB deflector is provided to cancel out aberration generated by the ExB deflector. And, Patent Literature 2 discloses a scanning electron microscope which cancels out aberration generated when the beam is deflected by using the ExB deflector. Patent Literature 3 describes that a position-sensitive detector is arranged in an image surface of signal electrons to visualize (make an image of) signal electrons, and direction information obtained by arranging the position-sensitive detector on a diffraction plane of signal electrons is also reflected in the image.

CITATION LIST

Patent Literature

Patent Literature 1: JP-B-2821153
Patent Literature 2: JP-B-3932894 (corresponding U.S. Pat. No. 6,864,482)
Patent Literature 3: JP-A-2004-134387 (corresponding U.S. Pat. No. 7,105,814)

SUMMARY OF INVENTION

Technical Problem

With further miniaturization of the semiconductor device and the like in these days, an aspect ratio (depth of structure/width of structure) of a structure, which is subject to observation, measurement, and inspection by a scanning electron microscope or the like is becoming larger. Electrons which are discharged from a bottom part of the structure are very important to know information on the bottom part, but electrons (such as secondary electrons) which are discharged from the bottom part include those which collide with a side wall of the structure and are unable to come up to the sample surface. For the electron microscope which is required to have much higher resolution, it is necessary to decrease the focal distance of the objective lens as much as possible, but electrons which are discharged from the sample are bent more largely. And, when a beam shift for realizing acceleration of visual field movement is performed by moving an electron beam scanning region (visual field (Field Of View: FOV)) by deflection by the deflector, the beam is irradiated to a position away from an ideal optical axis of the beam (a beam trajectory when the beam is not deflected), so that a converging action of the objective lens acts to deflect the secondary electrons or the like which are discharged from the sample.

In order to make sample information obvious based on the electrons which are discharged from a bottom part of a high-aspect structure, it is desirable to detect selectively the electrons which are emitted in a direction with a narrow angle relative to the ideal optical axis while considering the deflection action as described above, but Patent Literatures 1-3 do not have any disclosure about a method for detecting such electrons selectively.

A charged particle beam device is proposed below aiming at revealing more information based on charged particles which are discharged from the bottom part of a high-aspect structure without depending on the above-described deflection action.

Solution to Problem

As one aspect to achieve the object described above, there is proposed a charged particle beam device, including a deflector which deflects a charged particle beam discharged from a charged particle source; a detector which detects charged particles obtained by scanning the charged particle beam; a first orthogonal electromagnetic field generator which deflects charged particles discharged from a sample; a second orthogonal electromagnetic field generator which deflects the charged particles deflected by the first orthogonal electromagnetic field generator; an aperture forming member having a pass-through aperture for the charged particle beam; and a third orthogonal electromagnetic field generator which deflects the charged particles which passing through the aperture forming member.

Further, as another aspect, there is proposed a charged particle beam device, further including an aberration corrector (for example, a fourth orthogonal electromagnetic field generator) on a side toward the charged particle source with respect to the third orthogonal electromagnetic field generator.

Advantageous Effects of Invention

According to the above structure, it becomes possible to reveal information which is discharged from a bottom part of a high-aspect structure without depending on a deflection action or the like of an objective lens or the like.

DESCRIPTION OF EMBODIMENTS

Figure 1:
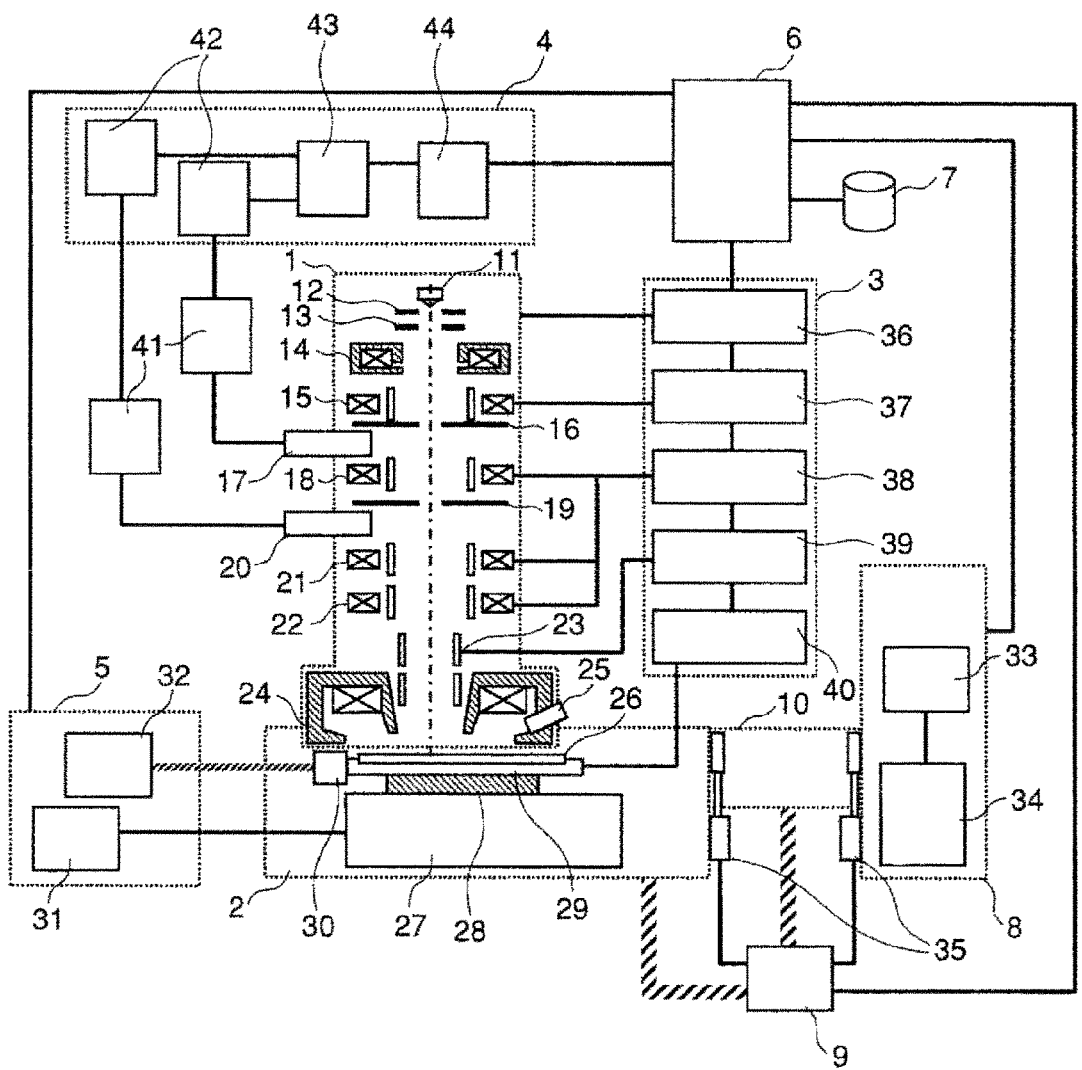
FIG. 1 shows a schematic configuration diagram of a scanning electron microscope.

In recent years, for the structure of the semiconductor device, a three-dimensional structure which is represented by Fin-FET is applied to realize higher integration in addition to a planar structure. The circuit pattern of the highly integrated device is miniaturized to tens of nanometers, and its aspect ratio has been deepened significantly in these years.

For example, the circuit pattern is processed with an aspect ratio of 10 or more in a gate of a flash memory, and an aspect ratio of 30 or more in a contact hole. Until now, for the manufacturing line of a semiconductor, a CD-SEM (Critical Dimension Scanning Electron Microscopy) capable of measuring dimensions of a pattern with sub-nanometer accuracy has been used to manage the process status. But, with increasing aspect ratio of the pattern, it is demanded that the pattern bottom part be also measured with high accuracy, and there is a big issue how high-accuracy, non-destructive measurement is realized.

The embodiment described below describes first a charged particle beam device that reveals information based on electrons which are discharged from a bottom part of a high-aspect structure. And, to realize high spatial resolution at a low acceleration in the CD-SEM, retarding which decelerates the electron beam directly above the sample and an objective lens of a short focal distance with small aberration are essential. And, it is desirable that an E×B type filter is used to detect efficiently the signal electrons accelerated by retarding. An E×B type filter is an orthogonal electromagnetic field generator having, for example, an electrode which generates a deflecting electric field for secondary electrons and magnetic poles which generate a magnetic field intersecting the electric field; the electron beam can be deflected by the generated magnetic field to a direction opposite to the deflection direction of the secondary electron, so that the deflection action of the deflecting electric field on the electron beam can be cancelled out while maintaining the deflection action of the secondary electrons.

The E×B type filter is quite effective technology for realization of high spatial resolution at a low acceleration. However, the signal electrons which are discharged from the sample are collectively captured by the detector, so that the contrast of the image is uniquely determined according to the accelerating voltage.

On the other hand, to reflect three-dimensional information of a sample from a top face observation image by an electron microscope, there is a technology to detect by selecting a signal electron emitting angle. However, it is necessary to detect signal electrons while maintaining the signal electron emitting angle and energy information, and it is important how the signal electrons are isolated with high accuracy. To isolate the signal electrons, the above-described E×B type filter is effective, but it is necessary to provide the E×B type filter in plural stages in order to suppress energy dispersion of the signal electrons generated when the filter is operated, and to guide the signal electrons which have different emitting positions to the detector at a certain incident angle.

To measure a microscopic circuit pattern having a high aspect ratio in the future, a technology for discriminating the signal electrons with high flexibility and high accuracy is essential in addition to high spatial resolution. However, when the focal distance of the objective lens is decreased in order for high spatial resolution, the signal electrons are widely diverged to reach the detector because the objective lens acts as a magnifying lens on the signal electrons, and it is necessary to operate the E×B type filter strongly. On the other hand, when the E×B type filter is operated strongly for the purpose of discrimination of the signal electrons, it becomes difficult to maintain high spatial resolution due to an influence of aberration.

Second, the embodiment described below describes a scanning electron microscope which can perform observation, measurement, and inspection of a microscopic circuit pattern or the like having a high aspect ratio by achieving both of high spatial resolution and signal discrimination having high flexibility with high accuracy.

Figure 9:
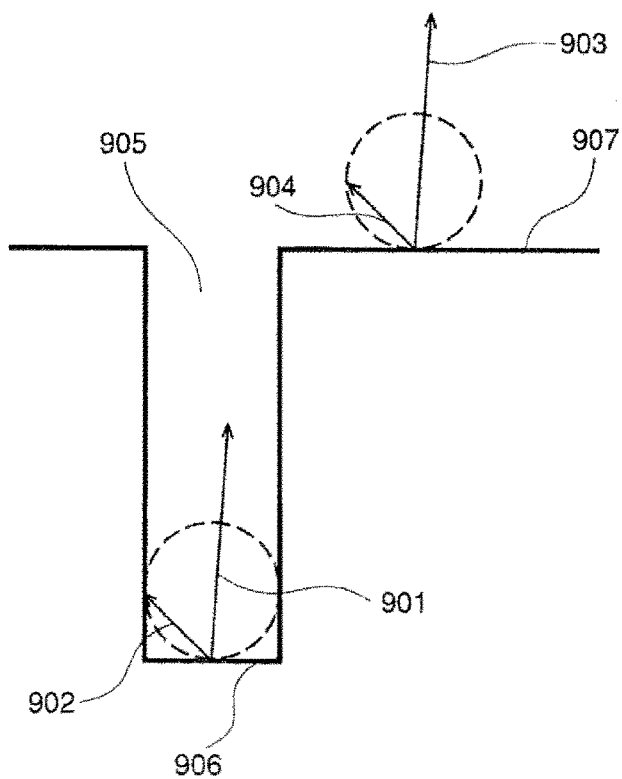
FIG. 9 shows trajectories of electrons which are discharged from a sample surface and electrons which are discharged from a hole bottom.

To reveal information based on electrons which are discharged from a bottom part of a high-aspect structure, it is necessary to detect selectively electrons having a small relative angle to an ideal optical axis in an emission direction (high angle electrons). As exemplified in FIG. 9, in electrons which are discharged from a bottom part 906 of a high-aspect structure (hole 905), high angle electrons 901 can escape toward the sample surface. Conversely, low angle electrons 902 having a large relative angle collide with a side wall of the structure. Thus, the electrons 901 can be detected but it is difficult to detect the electrons 902. On the other hand, electrons 903, 904 which are discharged from a structure surface 907 can be detected highly efficiently irrespective of a size of the relative angle. Namely, the bottom part of the structure is inferior in detection efficiency because the electrons 902 cannot be detected, and as a result, for the bottom part a dark image is formed when compared with the sample surface.

On the other hand, if the high angle electrons can be detected selectively, a difference of detection efficiency between the bottom part and the sample surface is suppressed and, therefore, it becomes possible to reveal information of the bottom part. Therefore, if there is a member capable of selectively passing through the high angle electrons while blocking the low angle electrons, the above purpose can be achieved.

Therefore, the following embodiment describes a charged particle beam device which is provided with a first orthogonal electromagnetic field generator for deflecting charged particles which are discharged from a sample, a second orthogonal electromagnetic field generator for further deflecting the charged particles deflected by the first orthogonal electromagnetic field generator, an aperture forming member having a pass-through aperture for the charged particle beam, and a third orthogonal electromagnetic field generator for deflecting the charged particles which have passed through the aperture forming member.

Electrons which are discharged from a position other than the intersection of the ideal optical axis and the sample surface are deflected off the axis by the deflection action of the lens. The charged particles are deflected toward the ideal optical axis by the first orthogonal electromagnetic field generator, and the trajectory of the charged particles deflected by the first orthogonal electromagnetic field generator is deflected to become parallel to the ideal optical axis by the second orthogonal electromagnetic field generator which is arranged on the charged particle source side relative to the first orthogonal electromagnetic field generator. In addition, an aperture part forming member which is arranged on the charged particle source side relative to the second orthogonal electromagnetic field generator is provided with the pass-through aperture for the charged particle beam, so that high angle charged particles in the charged particles, which are deflected by the second orthogonal electromagnetic field generator and move along the ideal optical axis, pass selectively through the pass-through aperture. Namely, the high angle electrons 901, 903 which are exemplified in FIG. 9 pass through selectively, so that it becomes possible that an image with a relatively bright bottom part is formed.

When the charged particles are once deflected along the ideal optical axis in order for angular discrimination, they then pass through the apertures which are formed in the detector and the conversion plate which are provided to allow the beam pass through them, so that after the angular discrimination, the charged particles having passed through the aperture part forming member are deflected toward a detection surface of the detector or the conversion plate by the third orthogonal electromagnetic field generator, and it becomes possible to detect the high angle charged particles selected by the angular discrimination highly efficiently.

In addition, the aberration corrector (for example, the fourth orthogonal electromagnetic field generator) may be provided on the charged particle source side relative to the third orthogonal electromagnetic field generator, and it becomes possible to cancel aberration which is generated in a plurality of orthogonal electromagnetic field generators including the third orthogonal electromagnetic field generator.

As described above, the structure, in which the four staged orthogonal electromagnetic field generators are provided so that the lower two stage orthogonal electromagnetic field generators are caused to perform trajectory deflection for angular discrimination of the charged particles and the upper two stage orthogonal electromagnetic field generator are caused to perform deflection to detect the charged particles and cancellation of the aberration generated by the lower stage orthogonal electromagnetic field generators, enables realization of accommodation of revealing of information based on the charged particles which are discharged from the hole bottom and enhancement of resolving power of the device without depending on the beam irradiated position.

In the embodiment described below, a scanning electron microscope is described which comprises a detector for mainly detecting electrons which are obtained by irradiating an electron beam to a sample, an aperture forming member which is arranged between the detector and a deflector and has a pass-through aperture for the electron beam, and a secondary signal deflector for deflecting electrons which are discharged from the sample, wherein a function is provided to compensate aberration generated by the secondary signal deflector by one E×B type filter arranged on the electron source side with respect to the detector. By having the above-described structure, it becomes possible to measure the bottom of the high-aspect structure with high accuracy.

The E×B type filter which does not act on the optical axis of a primary electron beam and controls only the trajectories of signal electrons is arranged in plural in order to discriminate the signal electrons with high flexibility and high accuracy in addition to high spatial resolution, and the aberration generated by such E×B type filters is cancelled by one E×B type filter arranged above the detector. Thus, a space can be reduced substantially by arranging one E×B type filter above the detector to cancel the aberration, and the E×B which cancels the aberration does not need to deflect the signal electrons so that a structure specialized in cancellation of aberration can be adopted.

This embodiment describes an example that the trajectories of signal electrons are mainly controlled by the E×B type filter, and when they are passed through the signal electron restriction plate, the aberration generated by the E×B type filter is cancelled by one E×B type filter arranged above the detector. First, a structure and a principle are shown.

FIG. 1 is a schematic configuration diagram of an ESM type semiconductor measuring device. A basic structure of the SEM type semiconductor measuring device of this embodiment is described below. The measuring device is roughly comprised of an SEM housing 1, a sample chamber 2, a housing control portion 3, a signal processing portion 4, a stage control portion 5, a wafer transfer portion 8, and a vacuum exhaust portion 9, and they all are configured to be controllable by a console 6. The console 6 has a large capacity storage medium 7 which can store recipes, measured results, and obtained scanned images, and the device operation and data management are performed based on the data recorded in the storage medium 7. Here, vacuum is maintained in the SEM housing 1 and the sample chamber 2 by an exhaust pump included in the vacuum exhaust portion 9, and the vacuum exhaust portion 9 is controlled from the console 6 depending on purposes, so that the SEM housing 1, the sample chamber 2, and a sample preparation chamber 10 can be exhausted or leaked. The structure of each portion and the function that is performed by the portion are described below sequentially.

(SEM Housing 1)

The SEM housing 1 comprises an electron source 11, an extraction electrode 12, an anode electrode 13, a condenser lens 14, an E×B type filter a 15, a conversion plate 16, a detector a 17, an E×B type filter b 18, a signal electron restriction plate 19, a detector b 20, an E×B type filter c 21, an E×B type filter d 22, a deflector 23, an objective lens 24, and a height sensor 25. The SEM housing 1 extracts a primary electron beam according to a potential difference between the electron source 11 and the extraction electrode 12. The primary electron beam is converged by the condenser lens 14 so as to pass through the holes formed in the center of the conversion plate 16 and the signal electron restriction plate 19.

Subsequently, the primary electron beam is changed in their trajectories by the deflector 23 so as to two-dimensionally scan a desired region on a sample 26 and then converged and irradiated onto the sample 26 by the objective lens 24. Here, a voltage for decelerating the primary electron beam is applied to the sample 26 placed in the sample chamber 2 from a retarding power supply within the housing control portion 3. Signal electrons which are discharged from the sample 26 are accelerated to energy corresponding to the voltage applied to the sample 26, passed through the objective lens 24 and the deflector 23, collided with the signal electron restriction plate 19 and the conversion plate 16, and captured by the detector b 20 and the detector a 17. The above is an ordinary structure of the SEM housing, but to compare two scanned images whose scanning directions are different by about 180 degrees in this embodiment, it is necessary that scanning signal would be accurately reversed between the two scanned images.

(Sample Chamber 2 and Wafer Transfer Portion 8)

The sample chamber 2 comprises a stage 27, an insulating material 28, a sample folder 29, and a mirror 30. The sample folder 29 and the grounded stage 27 are electrically insulated by the insulating material 28, and the sample 26 and the mirror 30 are electrically grounded to the sample folder 29. To the sample folder 29 high voltage can be applied from outside the sample chamber 2 via a feed-through. And, the stage 27 is two-dimensionally driven in the direction normal with respect to the center axis of the SEM housing 1 by a stage driving device 31 within the stage control portion 5, so that the entire region of the sample 26 can be moved to directly below the center axis of the SEM housing 1. Also, it is configured that the mirror 30 is attached to the sample folder 29 to measure the position of the sample 26 and a laser can be irradiated from a laser length measuring device 32 which is within the stage control portion 5 through a glass window which makes partitioning of the vacuum of the sample chamber 2, so that a scanned image of a desired position can be obtained by measuring the position of the sample 26 by the laser length measuring device 32 even when it is a semiconductor pattern where a microscopic pattern is integrated.

The wafer transfer portion 8 comprises a transfer control portion 33 and a transfer robot 34. In the wafer transfer portion 8, the transfer control portion 33 controls the transfer robot 34 according to the control signal from the console 6, and conveys the sample 26 which is placed in the wafer transfer portion 8 to the sample preparation chamber 10. Here, the sample 26 is conveyed stepwise from the wafer transfer portion 8 to the sample preparation chamber 10 and to the sample chamber 2, and valves 35 are provided between the individual portions. The console 6 controls the valves 35 and the vacuum exhaust portion 9 and can automatically convey the sample 26 so that the vacuum in the sample chamber 2 can always be maintained during the transfer operation.

(Housing Control Portion 3)

The housing control portion 3 operates the electron source 11 and various lenses included in the SEM housing 1 according to the control signal transmitted from the console 6. The housing control portion 3 comprises a housing control power supply 36, an aberration correction power supply 37, a signal electron trajectory control power supply 38, a primary electron trajectory control power supply 39, and a retarding power supply 40. The housing control power supply 36 supplies a constant voltage or a constant current to the electron source 11, the condenser lens 14, and the objective lens 24, and the primary electron beam converged on the sample 26 can be irradiated. The primary electron trajectory control power supply 39 supplies a voltage or a current to the deflector 23, and the primary electron beam can scan a desired part of the sample 26. The operation of the retarding power supply 40 is described in the above-described "(Sample chamber and wafer transfer portion)". The operation of the signal electron trajectory control power supply 38 is described in the later-described "(Signal electron trajectory control method)". The operation of the aberration correction power supply 37 is described in the later-described "(Aberration correction control method)".

(Signal Processing Portion 4)

The signal processing portion 4 creates scanned images of the sample 26 according to the control signal sent from the console 6. The signal processing portion 4 comprises an image memory 42, an image processing portion 43, and a signal processing portion 44. The console 6 sends a scanning signal to the primary electron trajectory control power supply 39 to form a scanned image, and the signal processing portion 4 performs sampling by synchronizing the signal detected by the detector a 17 and the detector b 20 with the scanning signal. The signals detected by the respective detectors are independently amplified by separately provided level adjusting circuits 41 and converted to digital signals, and stored in the memory 42 within the signal processing portion 4.

Here, the purpose of separately providing the level adjusting circuit 41 is to realize optimum signal amplification even if the signal amount is largely different between the detector a 17 and the detector b 20. The individual scanned images stored in the memory 42 are undergone calculation processing such as addition and subtraction by the image processing portion 43 and sent to the signal processing portion 44. The signal processing portion 44 outputs a signal waveform (line profile) of a prescribed region from the scanned image undergone the calculation processing and extracts information related to the sample shape from that waveform. Also, the signal processing portion 44 can output not only the scanned image undergone through the calculation processing, but also a signal waveform independently for the scanned images obtained by the individual detectors, and also information on the shape. Thus, a desired region can be measured with high accuracy by providing a function to combine appropriately the scanned images obtained by the individual detectors.

(Signal Electron Trajectory Control Method)

Figure 2:
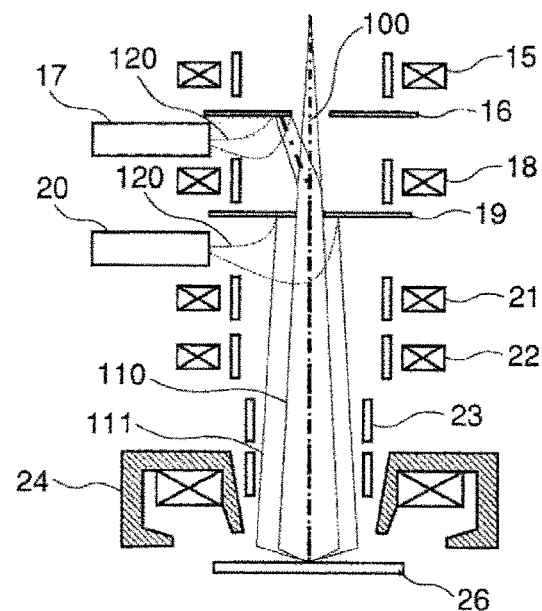
FIG. 2 shows an example of a scanning electron microscope for selectively detecting high angle electrons among electrons which are discharged from a sample.
Figure 3:
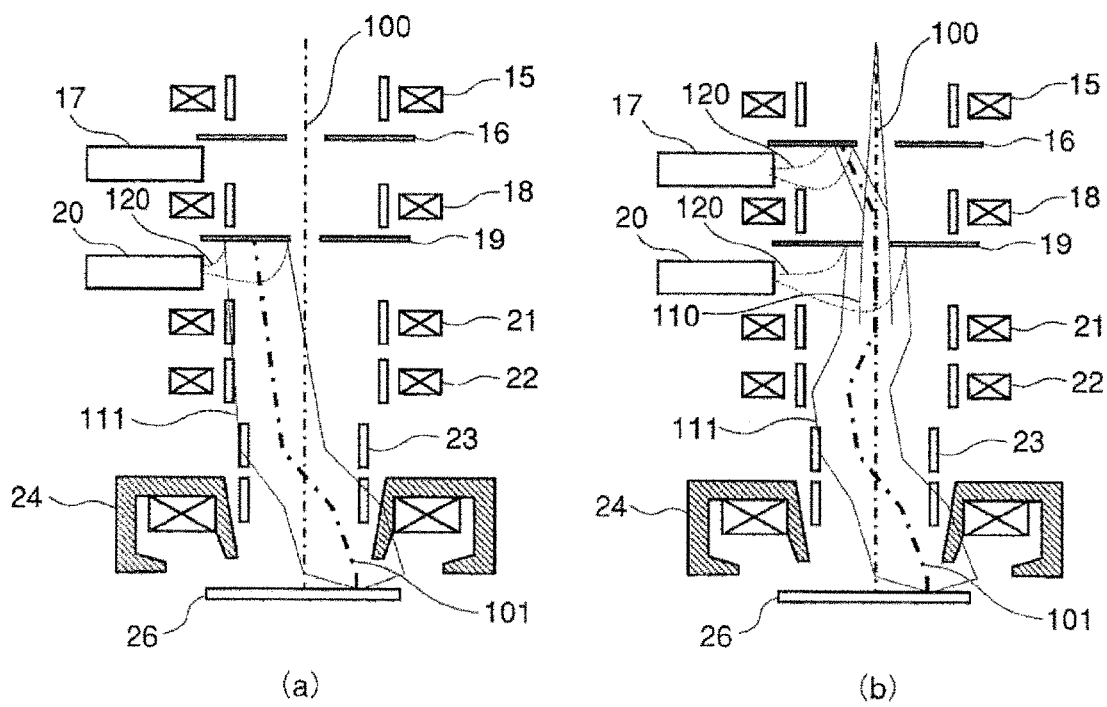
FIG. 3 shows an example of deflected trajectories of electrons according to an E×B type filter (orthogonal electromagnetic field generator).

Trajectory control of signal electrons is described next with reference to FIG. 2 and FIG. 3. FIG. 2 and FIG. 3 are partial extracts of the SEM housing 1 in the schematic configuration diagram of the SEM type semiconductor measuring device. FIG. 2 shows a principle of angular discrimination of signal electrons by the signal electron restriction plate 19, and the signal electrons which are discharged from the sample 26 travel from the sample 26 to the objective lens 24 along a center axis 100 within the SEM housing 1. The signal electron restriction plate 19 is an aperture part forming member having the electron beam pass-through aperture, and signal electrons 111 discharged at large elevation angles collide with the signal electron restriction plate 19, and generated tertiary electrons 120 are captured by the detector b 20. On the other hand, signal electrons 110 discharged at small elevation angles pass through the signal electron restriction plate 19, are bent by the ExB type filter b 18, and collide with the conversion plate 16, and the generated tertiary electrons are captured by the detector a 17. As described above, the technology to detect by discriminating the emitting angle of signal electrons can limit a capturing elevation angle of signal electrons by an aperture size of the signal electron restriction plate 19. The signal electrons 110 discharged at small elevation angles and the signal electrons 111 discharged at large elevation angles are detected independently, and the later-stage level adjusting circuits 41 execute amplification suitable for respective signal amounts, so that the three-dimensional structure of the sample can be visualized more clearly.

FIG. 3 shows a case that emitting positions of signal electrons by the structure of FIG. 2 are deviated from the center axis 100 of the SEM housing, and when the primary electron beam is deflected by the deflector 23, the signal electrons take trajectories largely off from the center axis 100. Part (a) of FIG. 3 shows a case that only the deflector 23 operates, and a center trajectory 101 of the signal electrons emitted deviating from the center axis 100 is bent in a convergence field of the objective lens 24 and a deflection field of the deflector 23. And, most of the signal electrons collide with the signal electron restriction plate 19 and are captured by the detector b 20. In this case, since the signal electrons collide with a position largely off of the aperture of the signal electron restriction plate 19, the angle limiting function by the aperture is not utilized.

Part (b) of FIG. 3 shows a case that the E×B type filter c 21 and the E×B type filter d 22 were interlocked as signal electron trajectory control in the case of Part (a). Here, both of the E×B type filter c 21 and the E×B type filter d 22 are adjusted in the intensities of the electric field and magnetic field so as not to change the trajectory of the primary electron beam, so that the signal electron emitting position is not different from that of Part (a) of FIG. 3. But, in Part (b) of FIG. 3, the signal electron trajectories bent by the objective lens 24 and the field of the deflector 23 are adjusted by two E×B type filters so that the center trajectory 101 of the signal electrons is perpendicular to the signal electron restriction plate 19 and overlaps the center axis 100 of the optical system, so that the same angular discrimination function as in FIG. 2 can be exhibited.

Thus, when the E×B type filter is arranged in multiple stages and interlocked with a deflection signal, it becomes possible to discriminate the emitting angle of signal electrons with high accuracy even when the primary electron beam is deflected.

(Aberration Correction Control Method)

The influence of aberration on the primary electron beam by the E×B type filter is chromatic aberration due to difference in deflection action between an electric field and a magnetic field and obscures the deflection direction. The size of the obscure depends on the operation amount of the E×B type filter and the distance of the primary electron beam to the crossover, and the obscure becomes larger as the operation amount is larger and the distance to the crossover is longer. In order to cancel the chromatic aberration, it is necessary to generate obscure in an opposite direction by another E×B type filter, and the chromatic aberration can be cancelled by adjusting so that the product of the operation amount of the E×B type filter and the distance to the crossover is inverted between positive and negative by the respective E×B type filters.

Figure 4:
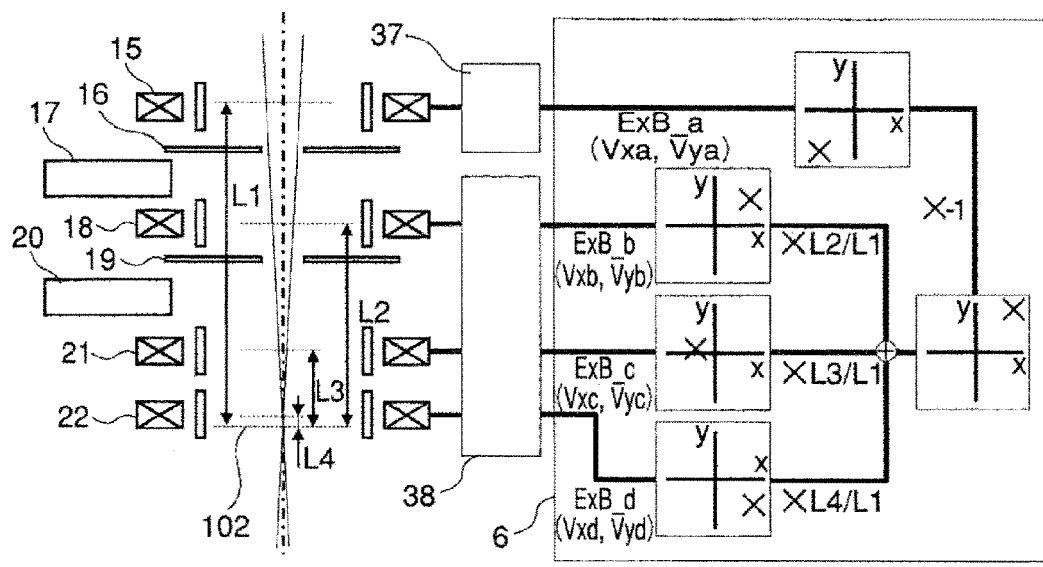
FIG. 4 shows an example of an aberration corrector.
Figure 5:
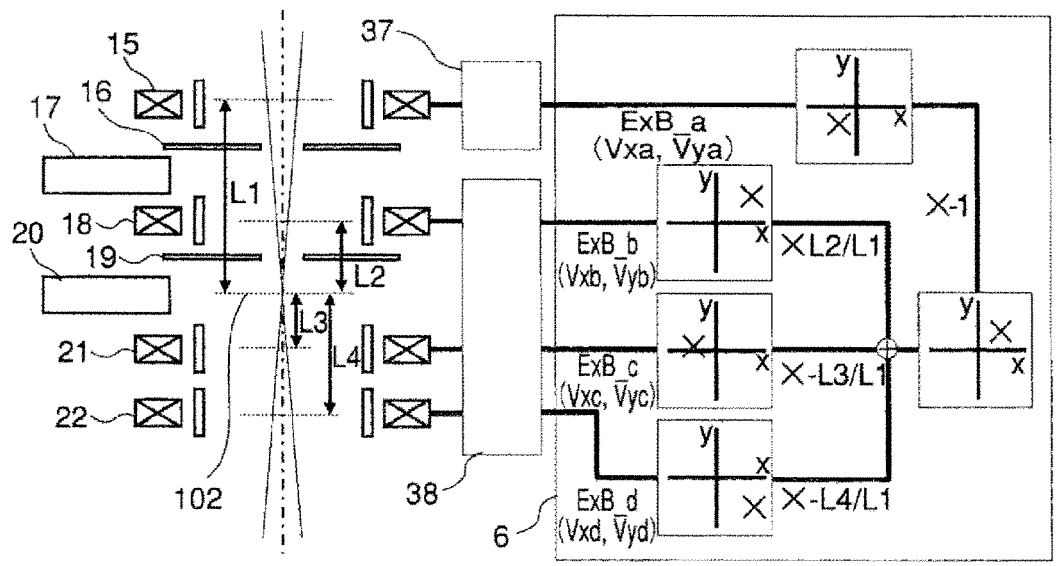
FIG. 5 shows an example of an aberration corrector.

A control method for cancelling the aberration as described above is described below with reference to drawings. FIG. 4 and FIG. 5 show a method for cancelling aberration, which is generated by E×B type filters arranged in multiple stages, by one E×B type filter; FIG. 4 shows a case that a crossover 102 is not within the operating multi-staged E×B type filters, and FIG. 5 shows a case that the crossover 102 is within the operating multi-staged E×B type filters. The respective figures show an extract around the E×B type filters in the SEM housing 1 in a schematic configuration diagram of the SEM type semiconductor measuring device, and its relevant control power supply and processing by the console 6.

In FIG. 4, the primary electron beam passes through the apertures of the conversion plate 16 and the signal electron restriction plate 19 and forms the crossover below the E×B type filter d 22. Here, an operation amount of each E×B filter which controls the trajectory of signal electrons is determined such that the E×B type filter b 18 is (Vxb, Vyb), the E×B type filter c 21 is (Vxc, Vyc), and the E×B type filter d 22 is (Vxd, Vyd), and when it is determined that the distance from each E×B type filter to the crossover 102 is L2, L3 and L4, the magnitude of the chromatic aberration generated by each E×B type filter is proportional to the following equations.

[MATH. 1]

$$\begin{pmatrix} dVxb \\ dVyb \end{pmatrix} = L2 \cdot \begin{pmatrix} Vxb \\ Vyb \end{pmatrix}, \begin{pmatrix} dVxc \\ dVyc \end{pmatrix} = L3 \cdot \begin{pmatrix} Vxc \\ Vyc \end{pmatrix}, \begin{pmatrix} dVxd \\ dVyd \end{pmatrix} = L4 \cdot \begin{pmatrix} Vxd \\ Vyd \end{pmatrix} \quad (1)$$

By standardizing the above equations with the distance L1 which is from the E×B type filter a 15 used for correction to the crossover 102 and adding them together, the chromatic aberrations of the E×B type filters from b to d can be composed.

[MATH. 2]

$$\begin{pmatrix} dVx \\ dVy \end{pmatrix} = \frac{L2}{L1} \cdot \begin{pmatrix} Vxb \\ Vyb \end{pmatrix} + \frac{L3}{L1} \cdot \begin{pmatrix} Vxc \\ Vyc \end{pmatrix} + \frac{L4}{L1} \cdot \begin{pmatrix} Vxd \\ Vyd \end{pmatrix} \quad (2)$$

In the above equation, (dVx, dVy) is a composition of chromatic aberration generated by the E×B type filters b to d, and the chromatic aberration generated can be cancelled out by operating the E×B type filter a 15 in a reverse polarity to (dVx, dVy) as in the following equation.

[MATH. 3]

$$\begin{pmatrix} Vxa \\ Vya \end{pmatrix} = -1 \cdot \begin{pmatrix} dVx \\ dVy \end{pmatrix} \quad (3)$$

It is also the same in FIG. 5, but it is necessary to invert the operation direction when composing in the positional relation between the E×B type filter and the crossover because the crossover 102 is between the operating multi-staged E×B type filters. This is because the moving direction of the crossover 102 is inverted between the cases that the crossover 102 is above and below the E×B type filter. In this case, when chromatic aberrations generated by the E×B type filters b to d are composed, it is expressed by the following equation.

[MATH. 4]

$$\begin{pmatrix} dVx \\ dVy \end{pmatrix} = \frac{L2}{L1} \cdot \begin{pmatrix} Vxb \\ Vyb \end{pmatrix} + (-1) \cdot \frac{L3}{L1} \cdot \begin{pmatrix} Vxc \\ Vyc \end{pmatrix} + (-1) \cdot \frac{L4}{L1} \cdot \begin{pmatrix} Vxd \\ Vyd \end{pmatrix} \quad (4)$$

In the above equation, −1 is multiplied to the second term and the third term because the crossover 102 is between the E×B type filter b 18 and the E×B type filter c 21. Similar to FIG. 4, to cancel out the composed chromatic aberration, by operating the E×B type filter a 15 in a reverse polarity to (dVx, dVy) the chromatic aberration generated can be cancelled out.

[MATH. 5]

$$\begin{pmatrix} Vxa \\ Vya \end{pmatrix} = -1 \cdot \begin{pmatrix} dVx \\ dVy \end{pmatrix} \quad (5)$$

To accurately perform the above control, it is necessary not only to perform the accurate operation of each E×B type filter, but also to accurately know the position of the crossover 102. In this case, the crossover 102 is determined by magnetic excitation of the condenser lens 14 in FIG. 1, so that it is necessary to store in advance the magnetic excitation of the condenser lens 14 and the distance from the condenser lens 14 to the crossover 102 as a database or a function equation in the console 6. The distance from the condenser lens 14 to each E×B type filter is determined by a design of the housing, so that aberration generated by the E×B type filters arranged in multiple stages by having the above-described database or a relational expression can be cancelled out by a single E×B type filter. The above equations were described with attention paid to an operating voltage for electrostatic deflect of the E×B filter. The operation amount of another electromagnetic deflection configuring the E×B type filter omitted in the above description must be determined to satisfy a Wien condition which does not change the trajectory of the primary electron beam. A method to determine the Wien condition is that a voltage for electrostatic deflection and a current for electromagnetic deflection may be determined so that the field of view of the scanned image does not move, or the voltage for electrostatic deflection and the current for electromagnetic deflection may be determined so that the optical axis does not deviate from a current center axis of the objective lens. This embodiment can exhibit the effect for the first time when all E×B type deflectors operate to satisfy the Wien condition.

When the technology shown in this embodiment is applied, signal electrons can be discriminated with high flexibility and high accuracy in addition to high spatial resolution.

(E×B Type Filter for Aberration Cancellation)

In this embodiment, aberration generated by multi-staged E×B type filters is corrected by one E×B type filter arranged above the detector. When this structure is used, it becomes unnecessary to mount an E×B type filter for aberration correction corresponding to the E×B type filter for deflecting signal electrons, and substantial space reduction can be realized. And, since the E×B type filter for correction is arranged above the detector, the E×B type filter can be optimized for specialization in aberration correction. In the above-described "(Aberration correction control method)", it was described with attention paid to only the chromatic aberration generated by the E×B type filter, but astigmatism can also be actively corrected. The astigmatism is caused due to insufficient assembling accuracy of the electrostatic deflector or the electromagnetic deflector or due to the passing-through of the primary electron beam deviating from the center of the E×B type filter.

Figure 6:
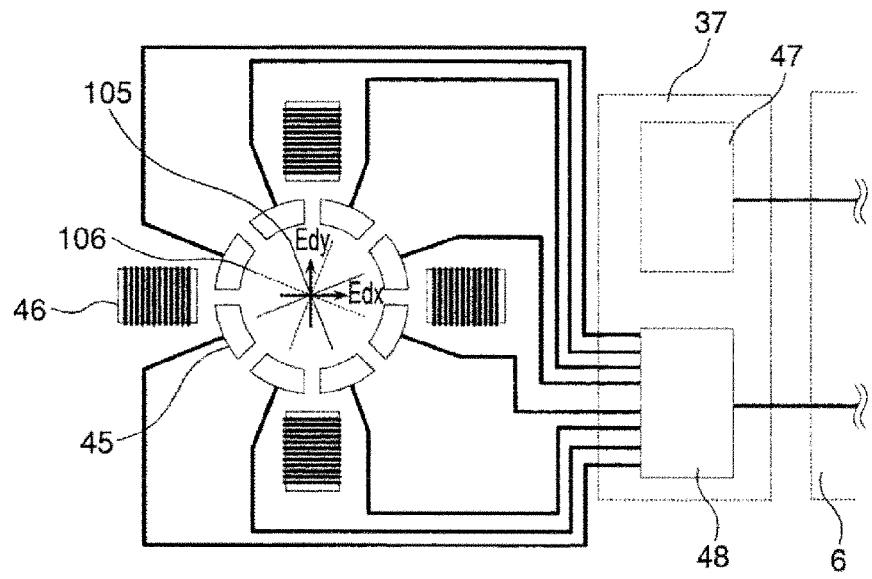
FIG. 6 shows an example of E×B type filters for aberration correction.
Figure 6:
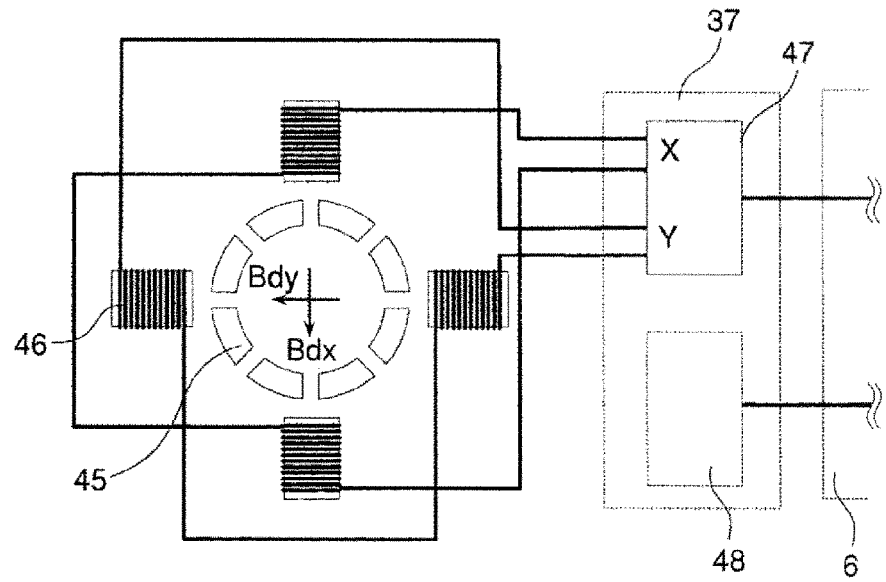

FIG. 6 shows a schematic configuration of the E×B type filter for aberration correction; Part (a) shows wiring for electrostatic deflection, and Part (b) shows wiring for electromagnetic deflection. Actually, Parts (a) and (b) must be drawn to overlap mutually but the electrostatic deflection and the electromagnetic deflection are shown separately for convenience. Here, correction of astigmatism generated by the E×B type filter is described. The E×B type filter shown in FIG. 6 has an XY electromagnetic deflector 46 combined with an electrostatic deflector 45 of an electrostatic octupole type. The electrostatic deflector 45 is connected to a voltage control circuit 48 within the aberration correction power supply 37, and a deflection field can be generated by applying prescribed voltages from the voltage control circuit 48 to the respective deflection electrodes based on the control signal from the console 6. And, the electromagnetic deflector 46 is connected to a current control circuit 47 within the aberration correction power supply 37, and a deflection field can be generated by passing prescribed currents from the current control circuit 47 to the respective deflection coils based on the control signal from the console 6. Correction of astigmatism by this E×B type filter can be realized by superposing an X direction correction component 105 and a Y direction correction component 106 of the astigmatism on the electrostatic octupole deflector. The respective correction components can be superimposed by adding the voltage of each correction component to a correction voltage for the color aberration, which was previously shown in connection with the voltage control circuit 48, based on the control signal from the console 6.

In a case where a correction function for astigmatism is superimposed on the electrostatic deflection, deviation of the optical axis caused by superposing the correction function might become a problem. This deviation of the optical axis is a phenomenon that occurs because the primary electron beam is deflected in an electrostatic field if the primary electron beam does not pass through the center of the electrostatic field where astigmatism is corrected. In this case, the E×B type filter does not operate so as to satisfy the Wien condition described above, so that even if the astigmatism can be corrected, there occurs an off-axis aberration due to no passage through the center axis of the objective lens 24. Generally, the astigmatism interlocks an aligner to correct the astigmatism to return the deviation of the optical axis due to the correction. This aligner may be for electrostatic deflection or electromagnetic deflection, and the aligner can be interlocked (hereinafter, this interlock is referred to as stigma alignment) so that the field of view of the scanned image does not move by the operation of astigmatic correction. In this embodiment, this stigma alignment is superimposed on the electromagnetic deflection of the E×B type filter. The stigma alignment can be superimposed by adding the current of stigma alignment to the current which is determined from the Wien condition previously shown with the current control circuit 47 based on the control signal from the console 6.

In FIG. 6, the operation of this embodiment was described with reference to the E×B type filter which combines the octupole electrostatic deflector and the XY electromagnetic deflection. But, this operation can also be realized by a 12-pole or quadrupole electrostatic deflector. In this case, the astigmatism cannot be corrected by the electrostatic deflector, so that the above-described operation can be realized by having an octupole electromagnetic deflector, and winding a coil for the aligner over the coil for astigmatic correction.

In this embodiment, aberration generated by a plurality of E×B type filters for controlling the trajectories of signal electrons is corrected by one E×B type filter which is arranged above the detector. Advantages of using the above structure include that it is not necessary to mount an E×B type filter for aberration correction corresponding to the E×B type filter for deflection of signal electrons as described above, and substantial space reduction can be realized. And, the E×B type filter for correction is arranged above the detector, and the E×B type filter can be optimized by specializing in the aberration correction.

Figure 7:
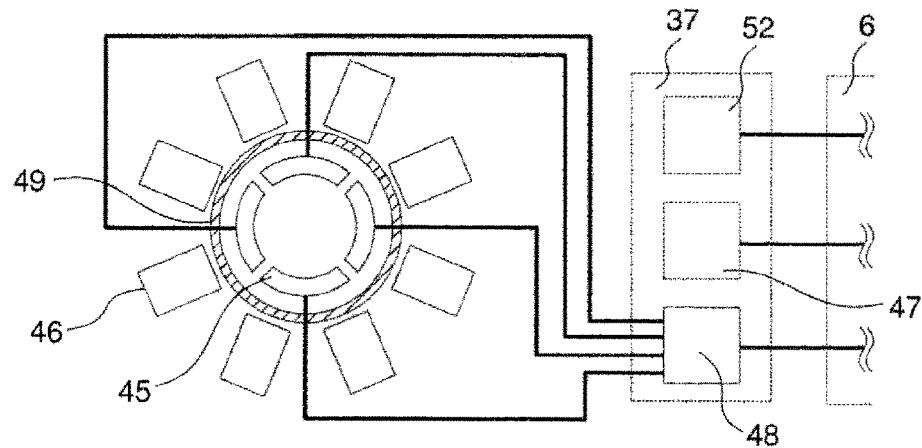
FIG. 7 shows an example of E×B type filters for aberration correction.
Figure 7:
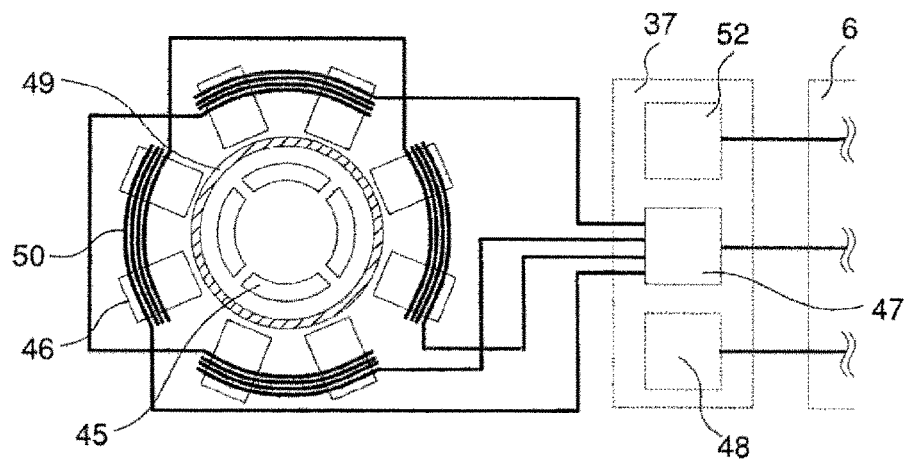
Figure 7:
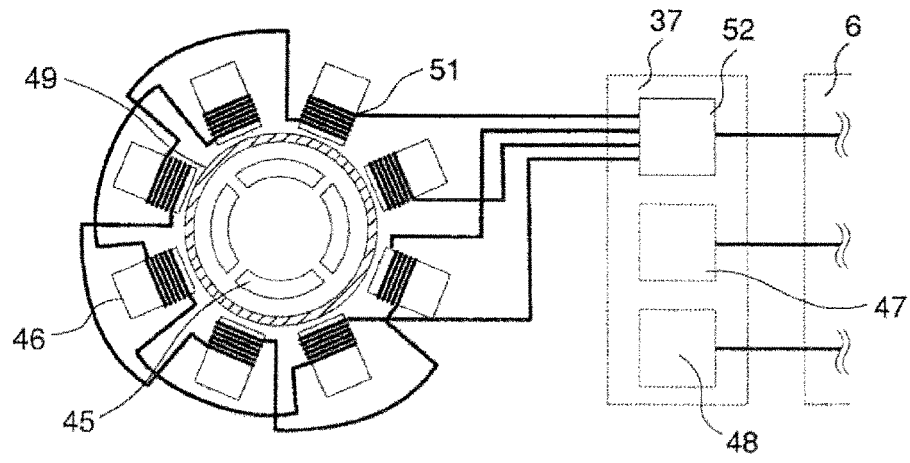

The ExB type filter for correcting the aberration does not need to allow passing-through of largely expanded signal electrons, so that the inner diameter of the electrostatic deflector can be decreased. FIG. 7 shows a schematic configuration of a case using a quadrupole electrostatic deflector, and the electromagnetic deflector is an octupole electrostatic deflector as described above and has a coil for aligner wound over a coil for astigmatic correction. In FIG. 7, Part (a) shows wiring for electrostatic deflection, Part (b) shows wiring for electromagnetic deflection, and Part (c) shows wiring for astigmatic correction. Actually, Parts (a), (b), and (c) must be drawn to overlap mutually but are shown separately for convenience. And, the ExB type filter shown in FIG. 7 has the electrostatic deflector 45 and the electromagnetic deflector 46 separated by a vacuum bulkhead 49. In this structure, the electrostatic deflector 45 is arranged in a vacuum, the electromagnetic deflector 46 is arranged in the atmosphere, and it has a significant advantage that the vacuum is not deteriorated because the electromagnetic deflector 46 accompanying heat generation by its operation is not arranged in the vacuum. This ExB type filter structure is an example of an optimum structure which can be realized for the first time by specializing in aberration correction and decreasing the inner diameter of the electrostatic deflector 45. The voltage control circuit 48 which is within the aberration correction power supply 37 is connected to the electrostatic deflector 45 in Part (a) of FIG. 7, and a deflection field can be generated by applying a prescribed voltage to the respective deflection electrodes from the voltage control circuit 48 based on the control signal from the console 6. The current control circuit 47 which is in the aberration correction power supply 37 is connected to an aligner coil 50 which is wound on the electromagnetic deflector 46 of Part (b) of FIG. 7, and a deflection field can be generated by passing a prescribed current from the current control circuit 47 to the respective deflection coils based on the control signal from the console 6. And, a current control circuit 52 for astigmatic correction which is within the aberration correction power supply 37 is connected to an astigmatic correction coil 51 which is wound on the electromagnetic deflector 46 of Part (c) of FIG. 7, and a field where the astigmatism is corrected can be generated by passing a prescribed current from the current control circuit 52 for astigmatic correction to the respective coils based on the control signal from the console 6.

When the ExB type filters for aberration correction described in this embodiment are arranged at a position where signal electrons pass through, the trajectories of signal electrons are deflected by the correction operation of color aberration and the correction operation of astigmatism, so that the effect described in "(Signal electron trajectory control method)" cannot be exhibited. By arranging the ExB type filters for aberration correction above the detector, the object of the present invention becomes possible for the first time for high spatial resolution and discrimination of signal electrons with high flexibility and high accuracy.

Figure 8:
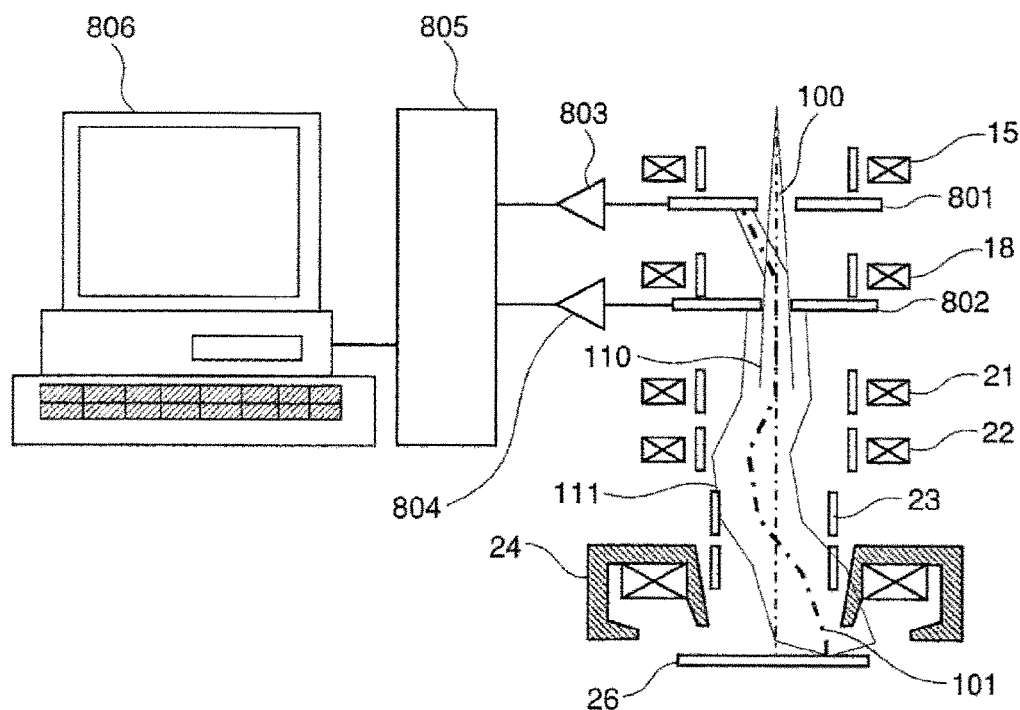
FIG. 8 shows an example of a scanning electron microscope adopting a lower detector as a shielding material for restricting low angle electrons from reaching an upper detector.

Next, another example of the scanning electron microscope provided with the multi-staged ExB filters is described. FIG. 8 shows a diagram showing an example of a scanning electron microscope which is provided with microchannel plates 801, 802 as detectors and amplifies and detects electrons which are discharged from the sample. In this case, the microchannel plate 802 becomes the aperture part forming member having the electron beam pass-through aperture. A signal detected by the microchannel plate 802 is amplified by an amplifier 804 and stored as an image signal or signal waveform information in an image memory provided in a control device 805. And, high angle electrons which have passed through the microchannel plate 802 are deflected to off the axis by the ExB type filter b 18, and captured by the microchannel plate 801. The signal detected by the microchannel plate 801 is amplified by an amplifier 803 and stored in the image memory. The image signal stored in the image memory can be shown on a display device 806, and the control device 805 also becomes a computing unit which adjusts the amplification factor of outputs of the upper stage detector and the lower stage detector to form a composite image.

As described above, high angle electrons can also be detected selectively by using the detector itself as a shielding member for angular discrimination.

REFERENCE SIGNS LIST

1 SEM housing
2 Sample chamber
3 Housing control portion
4, 44 Signal processing portion
5 Stage control portion
6 Console
7 Storage medium
8 Wafer transfer portion
9 Vacuum exhaust portion
10 Sample preparation chamber
11 Electron source
12 Extraction electrode
13 Anode electrode
14 Condenser lens
15 ExB type filter a
16 Conversion plate
17 Detector a
18 ExB type filter b
19 Signal electron restriction plate
20 Detector b
21 ExB type filter c
22 ExB type filter d
23 Deflector
24 Objective lens
25 Height sensor
26 Sample
27 Stage
28 Insulating material
29 Sample folder
30 Minor
31 Stage driving device
32 Laser length measuring device
33 Transfer control portion
34 Transfer robot
35 Valve
36 Housing control power supply
37 Aberration correction power supply
38 Signal electron trajectory control power supply
39 Primary electron trajectory control power supply
40 Retarding power supply
41 Level adjusting circuit
42 Memory
43 Image processing portion
45 Electrostatic deflector
46 Electromagnetic deflector
47 Current control circuit
48 Voltage control circuit
49 Vacuum bulkhead
50 Aligner coil
51 Astigmatic correction coil 52 Current control circuit for astigmatic correction
100 Center axis
101 Center trajectory of signal electrons
102 Crossover
105 X direction correction component of astigmatism
106 Y direction correction component of astigmatism
110, 111 Signal electrons
120 Tertiary electrons

The invention claimed is:

1. A charged particle beam device, comprising:
a first deflector which deflects a primary charged particle beam emitted from a charged particle source, so as to change a position of scanning area of the primary charged particle beam;
a detector which detects charged particles emitted from a sample in response to the primary charged particle beam;
a first orthogonal electromagnetic field generator which deflects the charged particles of emitted from the sample to an optical axis of the primary charged particle beam according to a deflection signal from the first deflector, when the first primary charged particle beam is deflected by the first deflector to a different position from the optical axis on the sample;
an aperture forming member which is disposed between the first orthogonal electromagnetic field generator and the charged particle source and has a pass-through aperture for the optical axis of the primary charged particle beam;
a second orthogonal electromagnetic field generator which deflects the charged particles emitted from the sample deflected by the first orthogonal electromagnetic field generator according to the deflection signal, so that the charged particles emitted from the sample deflected by the first orthogonal electromagnetic field generator travel along the optical axis of the first charged particle beam; and
a third orthogonal electromagnetic field generator which deflects the charged particles emitted from the sample passing through the aperture forming member from the optical axis to the detector or a conversion member converting the charged particles into secondary electrons.

2. The charged particle beam device according to claim 1, wherein the aperture forming member is a conversion plate which generates secondary electrons by collision of the charged particles of the second charged particle beam.

3. The charged particle beam device according to claim 2, wherein the detector detects electrons emitted from the conversion plate.

4. The charged particle beam device according to claim 1, wherein the aperture forming member is a detector which detects the charged particles emitted from the sample.

5. The charged particle beam device according to claim 1, further comprising an aberration corrector which is arranged on a side toward the charged particle source with respect to the third orthogonal electromagnetic field generator.

6. The charged particle beam device according to claim 1, wherein the first orthogonal electromagnetic field generator and the second orthogonal electromagnetic field generator change deflected states of the charged particles emitted from the sample according to a deflected state of the primary charged particle beam by the first deflector.

7. The charged particle beam device according to claim 6, wherein the first orthogonal electromagnetic field generator and the second orthogonal electromagnetic field generator deflect the charged particles emitted from the sample to make trajectories of the charged particles emitted from the sample parallel to an ideal optical axis of the primary charged particle beam.

8. A charged particle beam device, comprising:
a first deflector which deflects a first primary charged particle beam emitted from a charged particle source, so as to change a position of scanning area of the primary charged particle beam;
a detector which detects charged particles emitted from a sample in response to the primary charged particle beam;
a first orthogonal electromagnetic field generator which deflects the charged particles emitted from the sample to an optical axis of the primary charged particle beam when the first primary charged particle beam is deflected by the first deflector to a different position from the optical axis on the sample;
a second orthogonal electromagnetic field generator which further deflects the charged particles emitted from the sample deflected by the first orthogonal electromagnetic field generator;
an aperture forming member having a pass-through aperture for the optical axis of the primary charged particle beam;
a third orthogonal electromagnetic field generator which deflects the charged particles emitted from the sample passing through the aperture forming member from the optical axis to the detector or a conversion member converting the charged particles emitted from the sample into secondary electrons; and
a fourth orthogonal electromagnetic field generator which is arranged on a side toward the charged particle source with respect to the third orthogonal electromagnetic field generator, the fourth orthogonal electromagnetic field generator being supplied with a signal to cause aberration which cancels out composite aberration of the first orthogonal electromagnetic field generator, the second orthogonal electromagnetic field generator, and the third orthogonal electromagnetic field generator.

* * * * *